(12) United States Patent
Biyajima et al.

(10) Patent No.: US 12,344,773 B2
(45) Date of Patent: Jul. 1, 2025

(54) MASK ADHESIVE AND PELLICLE COMPRISING SAME

(71) Applicant: MITSUI CHEMICALS, INC., Tokyo (JP)

(72) Inventors: Tsuneaki Biyajima, Iwakuni (JP); Daiki Taneichi, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 677 days.

(21) Appl. No.: 16/982,624

(22) PCT Filed: Mar. 27, 2019

(86) PCT No.: PCT/JP2019/013094
§ 371 (c)(1),
(2) Date: Sep. 21, 2020

(87) PCT Pub. No.: WO2019/189310
PCT Pub. Date: Oct. 3, 2019

(65) Prior Publication Data
US 2021/0024791 A1    Jan. 28, 2021

(30) Foreign Application Priority Data
Mar. 30, 2018 (JP) .................... 2018-067006

(51) Int. Cl.
| | | |
|---|---|---|
| *C09J 123/02* | (2006.01) | |
| *C09J 153/02* | (2006.01) | |
| *G03F 1/64* | (2012.01) | |
| *C08K 5/01* | (2006.01) | |
| *C09J 193/04* | (2006.01) | |
| *H01L 21/673* | (2006.01) | |

(52) U.S. Cl.
CPC ......... *C09J 153/025* (2013.01); *C09J 123/02* (2013.01); *G03F 1/64* (2013.01); *C08K 5/01* (2013.01); *C09J 193/04* (2013.01); *H01L 21/67359* (2013.01); *Y10T 428/2883* (2015.01)

(58) Field of Classification Search
None
See application file for complete search history.

(56) References Cited

U.S. PATENT DOCUMENTS

| | | | | |
|---|---|---|---|---|
| 5,900,465 A | * | 5/1999 | Nishikawa | ............. C09J 153/00 525/98 |
| 8,945,799 B2 | * | 2/2015 | Taneichi | ................. C08L 57/02 430/5 |
| 2008/0090418 A1 | | 4/2008 | Jeon et al. | |
| 2008/0090419 A1 | | 4/2008 | Koh et al. | |
| 2013/0101927 A1 | | 4/2013 | Taneichi et al. | |

FOREIGN PATENT DOCUMENTS

| | | | |
|---|---|---|---|
| JP | H04237056 A | 8/1992 | |
| JP | H11323072 A | 11/1999 | |
| JP | 2000267261 A | 9/2000 | |
| JP | 2008103718 A | 5/2008 | |
| JP | 2008103719 A | 5/2008 | |
| WO | 2012004951 A1 | 1/2012 | |
| WO | WO-2017209309 A1 * | 12/2017 | ............. C09J 11/06 |

OTHER PUBLICATIONS

Michael, Pfeifer, "Chapter 6—Degradation and Reliability of Materials" 2009, pp. 161-187 (Year: 2009).*
International Search Report (PCT/ISA/210) and an English translation thereof, and Written Opinion (PCT/ISA/237) mailed on Jun. 18, 2019, by the Japanese Patent Office as the International Searching Authority for International Application No. PCT/JP2019/013094.

* cited by examiner

*Primary Examiner* — Anish P Desai
(74) *Attorney, Agent, or Firm* — BUCHANAN INGERSOLL & IROONEY PC

(57) ABSTRACT

The present invention provides a mask adhesive that plastically deforms easily, no adhesive residue remains after peeling from the mask, ease of handling is excellent, and haze on a pellicle film is unlikely to be increased. A mask adhesive resolving this problem contains a thermoplastic elastomer (A) for which the temperature at which the loss tangent measured at a frequency of 1 Hz is at a maximum value is −20 to 30° C., a tackifier resin (B), and a process oil (C). The total of the proportion (% CP) of paraffin carbon and the proportion (% CN) of naphthene carbon in the process oil (C) is 50% or more. The temperature of the mask adhesive at which the loss tangent measured at a frequency of 1 Hz is at a maximum value is −10 to 30° C., and the sulfur content of the mask adhesive is 300 μg/g or less.

12 Claims, 2 Drawing Sheets

MASK ADHESIVE AND PELLICLE COMPRISING SAME

TECHNICAL FIELD

The present invention relates to an adhesive for bonding a pellicle to a mask and a pellicle including the adhesive.

BACKGROUND ART

In manufacturing processes of semiconductor devices such as LSIs and VLSIs and liquid crystal display panels, patterning is performed by irradiating a photosensitive layer or the like with light through a mask (also referred to as an exposure master plate or a reticle). In such a case, if foreign matter adheres to the mask, the light is absorbed by the foreign matter or the light is reflected at the surface of the foreign matter and bent. Consequently, a pattern to be formed may be deformed, or an edge thereof may be rugged, resulting in a problem that the dimensions, quality, appearance, and the like are impaired after patterning. In order to solve this problem, a method is employed in which adhesion of foreign matter is suppressed by mounting, on a surface of a mask, a pellicle including a pellicle film that transmits light.

A pellicle typically includes a metal pellicle frame and a pellicle film disposed on one end face of the pellicle frame. The pellicle frame has, on the other end face thereof, a mask adhesive layer for fixing the pellicle to a mask. When the pellicle is mounted on the mask, the pellicle is fixed by pressure-bonding the mask adhesive layer at a predetermined position of the mask.

As a mask adhesive used for bonding a pellicle to a mask, an adhesive containing a hydride of a styrene/isoprene/styrene-based triblock copolymer and a tackifier has been proposed (see, Patent Literature 1). A hot-melt adhesive containing a styrene/ethylene-propylene/styrene-based triblock copolymer and an aliphatic petroleum resin has also been proposed (see, Patent Literature 2). Furthermore, a tackiness agent containing an alkyl (meth)acrylate-containing block copolymer and a tackifier resin such as a (hydrogenated) petroleum resin has also been proposed (see, Patent Literature 3). An adhesive containing a styrene-based triblock copolymer, a tackifier resin, and a softening agent has also been proposed (Patent Literature 4).

To achieve high integration of semiconductor elements, miniaturization of patterns to be formed is necessary. Specifically, in order to integrate a large number of semiconductor elements in a small area, it is necessary to reduce the size of the semiconductor elements as much as possible. Accordingly, the widths of patterns and the gap (pitch) between adjacent patterns need to be reduced. However, there is a limitation in miniaturization of patterns because of resolution limitation in a method for forming a pattern by photolithography.

A known method for overcoming the resolution limitation in the photolithography process is double patterning. Double patterning is a technique for finally obtaining a fine pattern with a high density by dividing one circuit pattern into two patterns having a low density, respectively exposing the divided patterns to form two patterns, and combining the resulting two patterns (see, Patent Literatures 5 and 6). Double patterning is preferably applied to manufacturing of semiconductors of the next 22-nm generation (half-pitch: 32 nm) and the subsequent generation.

In double patterning, exposure is usually performed twice by using two masks. Therefore, it is important to increase the accuracy of relative positions between two patterns to be formed. That is, if the accuracy of relative positions between the pattern obtained by a first exposure and the pattern obtained by a second exposure is low, a desired pattern cannot be obtained. Therefore, the relative displacement of the two patterns to be formed needs to be reduced on the order of nanometers (nm).

CITATION LIST

Patent Literature

PTL 1
  Japanese Patent Application Laid-Open No. 2000-267261
PTL 2
  Japanese Patent Application Laid-Open No. H04-237056
PTL 3
  Japanese Patent Application Laid-Open No. H11-323072
PTL 4
  WO 2012/004951
PTL 5
  Japanese Patent Application Laid-Open No. 2008-103718
PTL 6
  Japanese Patent Application Laid-Open No. 2008-103719

SUMMARY OF INVENTION

Technical Problem

One factor that causes the relative displacement of two patterns is distortion of a mask. Presumably, when a pellicle is pressure-bonded to a mask, distortion of a pellicle frame is transmitted to the mask through a mask adhesive layer, and the mask is thereby distorted. Accordingly, it is considered that the distortion of the mask can be reduced by using, as the mask adhesive layer, a material (mask adhesive) that plastically deforms effectively.

One parameter representing the ease of plastic deformation of a mask adhesive is a loss tangent (hereinafter, also referred to as "tan $\delta$"). For example, in a mask adhesive, if a temperature at which tan $\delta$ has a maximum value (hereinafter, also referred to as a "tan $\delta$ peak temperature") is in the range of −10° C. to 30° C., the mask adhesive plastically deforms easily at a temperature (typically, room temperature) at which exposure of double patterning is performed. Therefore, a pellicle having such a mask adhesive layer is unlikely to cause a mask to be distorted.

However, a typical thermoplastic elastomer (for example, a styrene/ethylene-butylene/styrene block copolymer (SEBS) in Patent Literature 2) has a low tan $\delta$ peak temperature of about −70° C. to −50° C. A tackifier resin added for the purpose of adjusting tackiness and an adhesive force of an adhesive layer often has a higher tan $\delta$ peak temperature than this. However, in order to adjust the tan $\delta$ peak temperature of a mask adhesive to approximately room temperature by adjusting the content ratio of the thermoplastic elastomer and the tackifier resin, it is necessary to add the tackifier resin in a large amount, and the mask adhesive may become excessively soft. Such an excessively soft mask adhesive tends to remain on the surface of a mask after the pellicle is peeled from the mask. Furthermore, an excessively soft mask adhesive has high instantaneous adhesiveness. Thus, there may be a problem in that when the mask adhesive comes in contact with the hand, the mask adhesive is tacky, and handleability is also poor.

To address this problem, for example, Patent Literature 4 has proposed that a styrene/hydrogenated isoprene/styrene-based triblock copolymer having a relatively high tan δ peak temperature is used as a base polymer. According to the technology described in the above patent literature, not only deforms the mask adhesive easily plastically in a temperature region in which exposure is performed, but also almost no adhesive residue remains on a mask after a pellicle is peeled. It is also described that the pellicle has good handleability. However, according to studies conducted by the inventors, the use of, for example, the pellicle described in Patent Literature 4 for a long time may tend to increase haze of a pellicle film. If the haze of the pellicle film increases, patterning with a sufficient amount of light cannot be performed or the accuracy of patterning may decrease. Accordingly, when the haze of the pellicle film increases, the pellicle needs to be exchanged. The haze of a pellicle film refers to fine foreign matter adhering to the pellicle film and having a size of about several micrometers and may cause exposure failure.

The present invention has been made to address these problems in the related art. Specifically, there is provided a mask adhesive which is capable of suppressing displacement of patterns, which is unlikely to remain as an adhesive residue after peeling from a mask, which has good handleability, and which is unlikely to increase haze of a pellicle film even when repeatedly used. There is also provided a pellicle including the mask adhesive.

Solution to Problem

More specifically, according to the present invention, the following mask adhesive and pellicle provided with the same are provided.

[1] A mask adhesive comprising: 100 parts by mass of a thermoplastic elastomer (A) in which a loss tangent measured at a frequency of 1 Hz has a maximum value at a temperature of −20° C. to 30° C.; 20 to 150 parts by mass of a tackifier resin (B); and 20 to 150 parts by mass of a process oil (C), in which the thermoplastic elastomer (A) is at least one selected from the group consisting of a styrene-based thermoplastic elastomer, a (meth)acrylate-based thermoplastic elastomer, and an olefin-based thermoplastic elastomer, in the process oil (C), a total of a proportion (% CP) of paraffin carbon and a proportion (% CN) of naphthene carbon is 50% or more, in the mask adhesive, a loss tangent measured at a frequency of 1 Hz has a maximum value at a temperature of −10° C. to 30° C., and the mask adhesive has a sulfur content of 300 μg/g or less.

[2] The mask adhesive according to [1]: the process oil (C) has a sulfur content of 2,000 μg/g or less.

[3] The mask adhesive according to [1] or [2], in which: the proportion (% CP) of paraffin carbon in the process oil (C) is 50% or more.

[4] The mask adhesive according to any one of [1] to [3], wherein: the process oil (C) contains a paraffin-based process oil (C1); and the paraffin-based process oil (C1) has a number-average molecular weight of 300 to 1,500.

[5] The mask adhesive according to [4], wherein: the paraffin-based process oil (C1) has a kinematic viscosity of 50 to 400 mm$^2$/s at 40° C.

[6] The mask adhesive according to any one of [1] to [5], in which: an amount of outgas is 20.0 μg/g or less.

[7] The mask adhesive according to any one of [1] to [6], in which the thermoplastic elastomer (A) is a styrene-based thermoplastic elastomer.

[8] The mask adhesive according to [7], in which: the styrene-based thermoplastic elastomer is a triblock copolymer that has a first polystyrene block, a polyisoprene block having an isopropenyl group in a side chain thereof, and a second polystyrene block and/or ahydride of the triblock copolymer.

[9] The mask adhesive according to any one of [1] to [8], in which: the tackifier resin (B) has a softening point of 60° C. to 150° C., the softening point being measured based on a ring-and-ball method specified in JIS K-2207.

[10] The mask adhesive according to any one of [1] to [9], in which: the tackifier resin (B) has a number-average molecular weight of 300 to 3,000.

[11] The mask adhesive according to any one of [1] to [10], in which: the tackifier resin (B) is at least one selected from the group consisting of rosin and derivatives thereof, polyterpene resins and hydrides thereof, terpene phenolic resins and hydrides thereof, aromatic modified terpene resins and hydrides thereof, coumarone-indene resins, aliphatic petroleum resins, alicyclic petroleum resins and hydrides thereof, aromatic petroleum resins and hydrides thereof, aliphatic-aromatic copolymer-based petroleum resins, and dicyclopentadiene-based petroleum resins and hydrides thereof.

[12] A pellicle comprising a pellicle frame, a pellicle film disposed on one end face of the pellicle frame, and a mask adhesive layer disposed on the other end face of the pellicle frame and containing the mask adhesive according to any one of claims 1 to 11.

Advantageous Effects of Invention

The mask adhesive and the pellicle according to the present invention are capable of suppressing displacement of patterns, are unlikely to leave an adhesive residue after peeling from a mask, have good handleability, and are unlikely to increase haze of a pellicle film even when repeatedly used. That is, the mask adhesive and the pellicle according to the present invention are suitable for patterning for which a high patterning accuracy is required, such as double patterning.

DESCRIPTION OF EMBODIMENTS

1. Mask Adhesive

Figure 1:
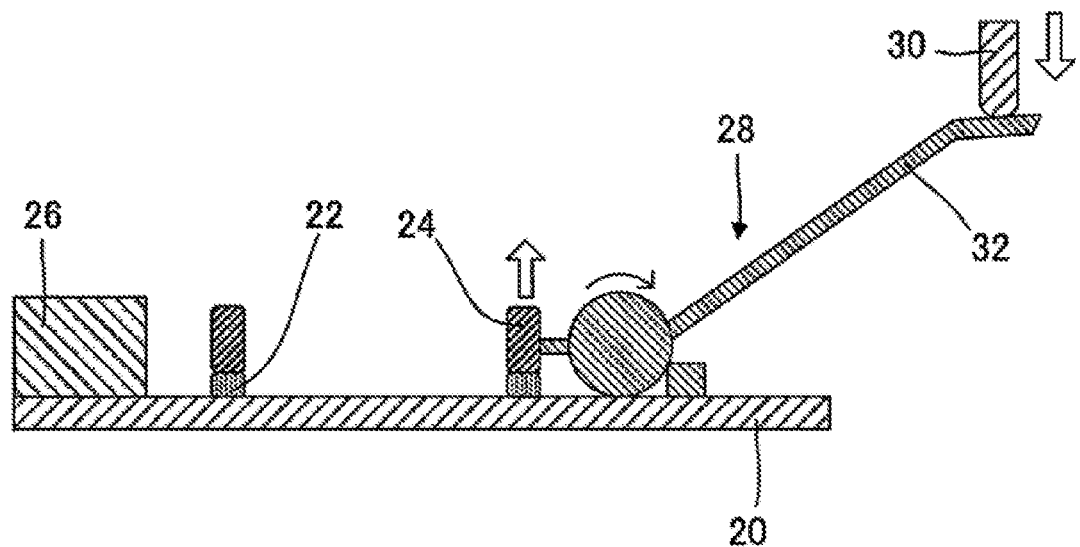
FIG. 1 is a sectional view that schematically illustrates a method for measuring a peel strength of a mask adhesive.

A mask adhesive according to the present invention contains a specific thermoplastic elastomer (A), a tackifier resin (B), and a process oil (C) at a predetermined ratio. The mask adhesive may further contain other components such as a softening agent and a wax, as required.

An existing mask adhesive containing a base polymer, a tackifier resin, and a softening agent may tend to generate a component that causes an increase in haze of a pellicle film when used in a pellicle. The inventors of the present invention have conducted extensive studies on the cause of the increase in haze of a pellicle film. According to the results, it has been found that a sulfur content of the mask adhesive significantly affects the increase in haze. The reason why the haze of the pellicle film is increased by sulfur in the mask adhesive is considered as follows. Application of light with a short wavelength, such as ArF light changes oxygen in the air to ozone. If the mask adhesive contains sulfur in a large amount, the sulfur, ozone, and an ammonium ion ($NH_4^+$) in the air react with each other to generate ammonium sulfate. The ammonium sulfate grows to form particles having a size of about several micrometers on the surface of the pellicle film, and the particles reflect and scatter light.

The sulfur contained in the mask adhesive is derived from impurities contained in a raw material of the mask adhesive and, in particular, derived from a natural petroleum resin, which has been hitherto used as a softening agent. Accordingly, in the present invention, the content of sulfur contained in the mask adhesive is set to 300 µg/g or less by, for example, using a process oil (C) having a low sulfur content. As a result, the generation of ammonium sulfate due to sulfur in the mask adhesive is unlikely to occur, and an increase in the haze of the pellicle film can be suppressed for a long time. The sulfur content of the mask adhesive is more preferably 10 µg/g or less, still more preferably 1 µg/g or less from the viewpoint of suppressing an increase in the haze.

The sulfur content of a mask adhesive can be determined as follows. First, the mask adhesive is precisely weighed in a sample boat and decomposed by combustion at 900° C. (combustion furnace set temperature) in a stream of $Ar/O_2$, and the generated gas is absorbed by a liquid absorbent. Subsequently, the component absorbed by the liquid absorbent is quantified by ion chromatography. An example of an apparatus used for ion chromatography is ICS-3000 (manufactured by Thermo Fisher Scientific Inc.).

Meanwhile, the mask adhesive according to the present invention contains a thermoplastic elastomer (A) having a relatively high loss tangent (tan δ) peak temperature and a tackifier resin (B) together with the process oil (C). In the mask adhesive, the temperature at which tan δ has a maximum value is −10° C. to 30° C. Accordingly, in particular, the mask adhesive plastically deforms easily at a temperature (for example, room temperature) at which typical exposure is performed and is unlikely to cause a mask to be distorted. In addition, the content of the tackifier resin (B) is suppressed to a predetermined range. Therefore, after the pellicle is peeled from a mask, an adhesive residue is unlikely to remain on the mask, and tackiness is also low. Accordingly, the pellicle using the mask adhesive also has good handleability. Thus, the mask adhesive according to the present invention is very useful as a mask adhesive for various pellicles.

Hereinafter, each component contained in the mask adhesive according to the present invention will be described.

1-1. Thermoplastic Elastomer (A)

The tan δ peak temperature of the thermoplastic elastomer (A) is −20° C. to 30° C., preferably −20° C. to 25° C., more preferably −20° C. to 20° C., still more preferably −20° C. to 0° C. When the thermoplastic elastomer (A) having a tan δ peak temperature in the above range is used as a base polymer, the resulting mask adhesive can have a tan δ peak temperature in the range of −10° C. to 30° C. even in a small amount of tackifier resin (B) blended. Therefore, a mask adhesive that plastically deforms easily in the exposure temperature region and that is less tacky can be provided.

The tan δ of the thermoplastic elastomer (A) is a value represented by a ratio (G"/G') of a loss modulus (G") to a storage modulus (G'). A larger maximum value of tan δ means that plastic deformation occurs easily. The maximum value of tan δ of the thermoplastic elastomer (A) is preferably in the range of 0.5 to 3, more preferably in the range of 0.9 to 2.0.

The tan δ (loss tangent) can be determined by using a dynamic viscoelasticity measuring apparatus (trade name "ARES", manufactured by TA Instruments, Inc.). Specifically, a disc-shaped specimen (diameter: 25 mm×thickness: 2 mm) is sandwiched between two parallel plates (diameter: 25 mm), which are measuring jigs, and the thickness of the specimen is adjusted to a predetermined initial gap. The storage modulus (G') and the loss modulus (G") are then measured in a nitrogen atmosphere, in a shear mode, at a frequency of 1 Hz, a measurement temperature of −80° C. to 200° C., and a temperature-increasing rate of 3° C./min, and with an initial gap of 2 mm. Subsequently, tan δ (=G"/G') is calculated from the storage modulus (G') and the loss modulus (G") determined above.

The sulfur content of the thermoplastic elastomer (A) is preferably 10 µg/g or less, more preferably 3 µg/g or less from the viewpoint of decreasing the sulfur content in the mask adhesive to suppress an increase in haze. The sulfur content in the thermoplastic elastomer (A) can be measured as in the sulfur content in the mask adhesive.

The thermoplastic elastomer (A) contained in the mask adhesive according to the present invention contains at least one of a styrene-based thermoplastic elastomer, a (meth) acrylate-based thermoplastic elastomer, and an olefin-based thermoplastic elastomer. The thermoplastic elastomer (A) may contain only one of the above elastomers or two or more of the above elastomers. Among the above elastomers, the styrene-based thermoplastic elastomer has good hydrolysis resistance because the styrene-based thermoplastic elastomer includes no ester bonding site in the molecular skeleton. In addition, the styrene-based thermoplastic elastomer is advantageous in that the styrene-based thermoplastic elastomer combines good flexibility and good mechanical strength because the elastomer has both a soft segment and a hard segment in the same molecular skeleton.

The styrene-based thermoplastic elastomer may be any elastomer including a structural unit derived from styrene and may be a block copolymer of styrene and an olefin other than styrene. The olefin other than styrene is preferably a monomer capable of forming a side chain having a bulky branched structure in the polymer block, such as isoprene or 4-methyl-1-pentene. Of these, isoprene is particularly preferred.

A ratio of the structural unit derived from styrene and included in the styrene-based thermoplastic elastomer is preferably 35 mass % or less, more preferably 20 mass % or less. If the content ratio of the structural unit derived from styrene is excessively high, compatibility with the tackifier resin (B) and the process oil (C) described below may decrease, and the styrene-based thermoplastic elastomer and these may be separated from each other.

The styrene-based thermoplastic elastomer is particularly preferably a triblock copolymer (hereinafter, also referred to as "SIS") having a first polystyrene block, a polyisoprene block having an isopropenyl group (1-methylethenyl group (—C(=$CH_2$)$CH_3$)) in a side chain thereof, and a second polystyrene block or a hydride (hereinafter, also referred to as "H-SIS") of the triblock copolymer. A triblock copolymer having a bulky branched structure, such as an isopropenyl group, in a side chain thereof usually has a high tan δ peak temperature of about −20° C. to 30° C. The "hydride of the triblock copolymer" means that an unsaturated bond in the "polyisoprene block" among the three polymer blocks included in SIS is hydrogenated. The amount of hydrogenation is preferably 90 mol % or more, more preferably 95 mol % or more.

Specific examples (commercially available products) of the SIS include trade name "HYBRAR 5127" (manufactured by Kuraray Co., Ltd., tan δ peak temperature: 20° C.) and trade name "HYBRAR 5215" (manufactured by Kuraray Co., Ltd., tan δ peak temperature: −3° C.). Specific examples (commercially available products) of the H-SIS include trade name "HYBRAR 7125" (manufactured by Kuraray Co., Ltd., tan δ peak temperature: −5° C.) and trade name "HYBRAR 7311" (manufactured by Kuraray Co., Ltd., tan δ peak temperature: −17° C.).

The (meth)acrylate-based thermoplastic elastomer may be any elastomer including a structural unit derived from a (meth)acrylate. The (meth)acrylate-based thermoplastic elastomer may be, for example, a diblock copolymer or a triblock copolymer of polymethyl (meth)acrylate and a (meth)acrylate other than polymethyl (meth)acrylate. Examples of the (meth)acrylate other than polymethyl (meth)acrylate include poly-n-butyl (meth)acrylate, poly-2-ethylhexyl (meth)acrylate, and polyisononyl (meth)acrylate. The (meth)acrylate other than polymethyl (meth)acrylate is preferably a polymer capable of forming a side chain having a bulky branched structure in the polymer block. Of these, poly-n-butyl (meth)acrylate is particularly preferred.

Specific examples (commercially available products) of the (meth)acrylate-based thermoplastic elastomer include trade name "LA-polymer" series (manufactured by Kuraray Co., Ltd.).

The olefin-based thermoplastic elastomer can be an elastomer including a copolymer of one or two or more α-olefins. Of these, non-crystalline or low-crystalline elastomer is preferred. Examples of the α-olefins constituting the olefin-based thermoplastic elastomer include ethylene, propylene, butene, pentene, hexene, heptene, octene, nonene, decene, undecene, dodecene, and 4-methyl-1-pentene.

Specific examples (commercially available products) of the olefin-based thermoplastic elastomer include trade name "TAFMER" (manufactured by Mitsui Chemicals, Inc.) and trade name "NOTIO" (manufactured by Mitsui Chemicals, Inc.).

The thermoplastic elastomer (A) is preferably contained in an amount of 29 to 71 mass %, more preferably 30 to 60 mass %, still more preferably 33 to 55 mass % relative to the total amount of the mask adhesive. When the amount of the thermoplastic elastomer (A) is in the above range, strength of the mask adhesive can be sufficiently increased.

1-2. Tackifier Resin (B)

The tackifier resin (B) preferably has a softening point of 60° C. to 150° C., more preferably 90° C. to 120° C., still more preferably 90° C. to 110° C.

When the softening point of the tackifier resin (B) is 60° C. or higher, the tackifier resin (B) is unlikely to bleed out from the mask adhesive. In addition, the mask adhesive easily has a tan δ peak temperature of −10° C. or higher, and displacement of patterns is unlikely to occur. On the other hand, when the softening point of the tackifier resin (B) is 150° C. or lower, the tackifier resin (B) has a tendency to exhibit excellent adhesion. The softening point of the tackifier resin (B) is measured in accordance with the ring-and-ball method specified in JIS K-2207.

The tackifier resin (B) preferably has a number-average molecular weight (Mn) of 300 to 3,000, more preferably 500 to 1,000. If the tackifier resin (B) has a number-average molecular weight (Mn) of less than 300, the softening temperature tends to be excessively low. On the other hand, if the tackifier resin (B) has a number-average molecular weight (Mn) of more than 3,000, the softening temperature tends to be excessively high. The number-average molecular weight (Mn) of the tackifier resin (B) is measured by gel permeation chromatography (GPC) using polystyrene standards.

The sulfur content of the tackifier resin (B) is preferably 10 μg/g or less, more preferably 3 μg/g or less from the viewpoint of decreasing the sulfur content in the mask adhesive to suppress an increase in haze. The sulfur content in the tackifier resin (B) can also be measured as in the sulfur content in the mask adhesive.

The tackifier resin (B) preferably has compatibility with the thermoplastic elastomer (A). Consequently, the tan δ peak temperature of the mask adhesive can be effectively shifted to the high-temperature side. From the viewpoint of compatibility with the thermoplastic elastomer (A), the tackifier resin (B) is preferably, for example, rosin and derivatives thereof, polyterpene resins and hydrides thereof, terpene phenolic resins and hydrides thereof, aromatic modified terpene resins and hydrides thereof, coumarone-indene resins, aliphatic petroleum resins, alicyclic petroleum resins and hydrides thereof, aromatic petroleum resins and hydrides thereof, aliphatic-aromatic copolymer-based petroleum resins, and dicyclopentadiene-based petroleum resins and hydrides thereof. These have high compatibility with the polyisoprene blocks of SIS and H-SIS.

Among the above, rosin and derivatives thereof, polyterpene resins and hydrides thereof, aliphatic petroleum resins, and alicyclic petroleum resins and hydrides thereof are preferred, and rosin and derivatives thereof, aliphatic petroleum resins, and alicyclic petroleum resins and hydrides thereof are particularly preferred. In the case where the thermoplastic elastomer (A) is the styrene-based thermoplastic elastomer described above, the tackifier resin (B) is preferably a hydride of an alicyclic petroleum resin from the viewpoint of reducing the sulfur content.

Specific examples (commercially available products) of the rosin and derivatives thereof include, in terms of trade name, "PINECRYSTAL", "SUPER ESTER", and "TAMANOL" (all of which are manufactured by Arakawa Chemical Industries, Ltd.). Specific examples (commercially available products) of the polyterpene resins, the terpene phenolic resins, the aromatic modified terpene resins, and hydrides thereof include, in terms of trade name, "YS RESIN", "YS POLYSTER", and "CLEARON" (all of which are manufactured by Yasuhara Chemical Co., Ltd.). Specific examples (commercially available products) of the aliphatic petroleum resins, the alicyclic petroleum resins and hydrides thereof, the aromatic petroleum resins and hydrides thereof, the aliphatic-aromatic copolymer-based petroleum resins, and the dicyclopentadiene-based petroleum resins and hydrides thereof include, in terms of trade name, "ARKON" (manufactured by Arakawa Chemical Industries, Ltd.), "HILETS" (manufactured by Mitsui Chemicals, Inc.), "I-MARV" (manufactured by Idemitsu Kosan Co., Ltd.), "QUINTONE" (manufactured by Zeon Corporation), and "ESCOREZ" (manufactured by Tonex Co., Ltd.). The mask adhesive may contain only one tackifier resin (B) or two or more tackifier resins (B).

The amount of the tackifier resin (B) contained in the mask adhesive is 20 to 150 parts by mass relative to 100 parts by mass of the thermoplastic elastomer (A). The amount of the tackifier resin (B) is preferably 50 to 130 parts by mass, more preferably 80 to 120 parts by mass relative to 100 parts by mass of the thermoplastic elastomer (A).

As described above, in the case where a resin (for example, SEBS) having a low tan δ peak temperature is used as the thermoplastic elastomer (A), it is necessary to add 200 to 300 parts by mass of the tackifier resin (B) relative to 100 parts by mass of SEBS so that the resulting mask adhesive has a tan δ peak temperature in the range of −10° C. to 30° C. In contrast to this, in the present invention, even when the amount of the tackifier resin (B) relative to 100 parts by mass of the thermoplastic elastomer (A) is 150 parts by mass or less, the resulting mask adhesive can have a tan δ in the range of −10° C. to 30° C. Therefore, the mask adhesive according to the present invention is less tacky, and almost no adhesive residue remains after the mask adhesive is peeled from a mask.

If the amount of the tackifier resin (B) relative to 100 parts by mass of the thermoplastic elastomer (A) is less than 20 parts by mass, it may become difficult to set the tan δ peak temperature of the resulting mask adhesive to −10° C. or higher. On the other hand, if the amount of the tackifier resin (B) exceeds 150 parts by mass, the resulting mask adhesive may be tacky, and an adhesive residue may remain after the mask adhesive is peeled from a mask.

1-3. Process Oil (C)

The process oil (C) is a petroleum fraction with a high boiling point and is generally classified into a paraffin-based process oil (C1), a naphthene-based process oil (C2), and an aromatic process oil. For the mask adhesive according to the present invention, a process oil having a total of paraffin carbon (% CP) and naphthene carbon (% CN) of 50% or more is used as the process oil (C). On the other hand, a proportion (% CA) of carbon constituting an aromatic ring is preferably 10% or less, more preferably 5% or less, still more preferably 1% or less from the viewpoint of decreasing the kinematic viscosity of the mask adhesive to further suppress displacement of patterns.

In the present specification, the paraffin-based process oil (C1) means a process oil having a proportion (% CP) of paraffin carbon to a total amount of carbon of the petroleum fraction of 50% or more, the proportion being measured by the ring analysis method (n-d-M method). The naphthene-based process oil (C2) means a process oil having a proportion (% CN) of naphthene carbon to a total amount of carbon of the petroleum fraction of 50% or more, The process oil (C) is not particularly limited as long as the total of % CP and % CN is 50% or more. The total of % CP and % CN is more preferably 70% or more, still more preferably 90% or more. For example, the paraffin-based process oil (C1) or the naphthene-based process oil (C2) may be used alone. Alternatively, a plurality of types of process oils may be mixed and used as the process oil (C). The proportion (% CP) of paraffin carbon in the process oil is particularly preferably 50% or more. In the case where a mixture of a plurality of types of process oils is used, % CP and % CN of the process oil (C) can be determined by analyzing % CP and % CN in the mixed state.

The sulfur content of the process oil (C) is preferably 500 μg/g or less, more preferably 100 μg/g or less, still more preferably 10 μg/g or less so that the mask adhesive has a sulfur content of 300 μg/g or less. The sulfur content in the process oil (C) can be determined by ion chromatography described above.

Commercially available paraffin-based process oil (C1) and naphthene-based process oil (C2) that have low sulfur contents may be used alone or in combination so that the process oil (C) has a sulfur content in the above range. On the other hand, the sulfur content may be reduced by subjecting a paraffin-based process oil (C1) or naphthene-based process oil (C2) having a relatively high sulfur content to adsorption treatment, hydrogenation treatment, or the like.

Specific examples (commercially available products) of the paraffin-based process oil (C1) having a low sulfur content include trade name "DIANA PROCESS OIL PW-90" and trade name "DIANA PROCESS OIL PW-380" (both of which are manufactured by Idemitsu Kosan Co., Ltd.).

In the case where the process oil (C) contains a paraffin-based process oil (C1), the paraffin-based process oil (C1) preferably has a kinematic viscosity of 50 to 400 mm$^2$/s, more preferably 60 to 100 mm$^2$/s, at 40° C. When the kinematic viscosity is in the above range, the mask adhesive can be easily applied to a pellicle frame. The kinematic viscosity is a value measured in accordance with JIS K2283 (2000).

The number-average molecular weight (Mn) of the paraffin-based process oil (C1) is 300 to 1,500, preferably 300 to 1,200, more preferably 400 to 800. When the paraffin-based process oil (C1) has a molecular weight in the above range, the mask adhesive can be easily applied to a pellicle frame. The number-average molecular weight (Mn) of the process oil (C) is measured by gel permeation chromatography (GPC) using polystyrene standards.

On the other hand, specific examples (commercially available products) of the naphthene-based process oil (C2) having a low sulfur content include trade name "SNH3" (manufactured by Sankyo Yuka Kogyo K.K.), trade name "SNH8SP" (manufactured by Sankyo Yuka Kogyo K.K.), and trade name "SUNPURE N100" (manufactured by Japan Sun Oil Company, Ltd.).

In a molecular-weight distribution chart obtained by gel permeation chromatography (GPC) of the process oil (C), a ratio of the area of a region where the molecular weight is 500 or less is preferably 5% or less, more preferably 4% or less relative to the total peak area. The use of such a process oil (C) having a small content of a low-molecular-weight component enables the amount of outgas from the mask adhesive to be reduced. The area ratio of the low-molecular-weight region can be controlled by polymerization conditions and refining of the process oil (C).

The amount of the process oil (C) contained in the mask adhesive is 20 to 150 parts by mass relative to 100 parts by mass of the thermoplastic elastomer (A). The amount of the process oil (C) is preferably 40 to 100 parts by mass, more preferably 50 to 70 parts by mass. When the amount of the process oil (C) is in the above range, flexibility of the mask adhesive increases easily.

1-4. Other Components

The mask adhesive may further contain a component other than the thermoplastic elastomer (A), the tackifier resin (B), and the process oil (C) within a range that does not impair the objects and advantages of the present invention. Examples of the other component include a softening agent and a fluidity modifier.

The softening agent may be any material that is a component other than the process oil (C) and is capable of imparting flexibility to the thermoplastic elastomer (A). Specific examples of the softening agent include polybutene, hydrogenated polybutene, unsaturated polybutene, aliphatic hydrocarbons, and acrylic polymers. However, an increase in the amount of softening agent such as polybutene tends to increase the amount of outgas generated during the use of the mask adhesive. Accordingly, the amount of softening agent is preferably 5 parts by mass or less, more preferably 1 part by mass or less relative to 100 parts by mass of the thermoplastic elastomer (A).

The fluidity modifier is a component for adjusting fluidity of the resulting mask adhesive. Examples of the fluidity modifier include waxes of various resins. Specific examples of the wax include high-elasticity materials such as polyethylene wax and polypropylene wax. The amount of fluidity modifier is preferably 10 parts by mass or less, more preferably 1 part by mass or less relative to 100 parts by mass of the thermoplastic elastomer (A) from the viewpoint of further reducing the remaining of adhesive residue.

1-5. Physical Properties of Mask Adhesive

The tan δ peak temperature of the mask adhesive according to the present invention is −10° C. to 30° C. The tan δ peak temperature is more preferably −5° C. to 30° C., still more preferably −1° C. to 15° C. For example, a mounting operation of a pellicle on a mask and exposure using the mask are usually performed at room temperature. Therefore, when the mask adhesive has a tan δ peak temperature in the above range, the mask adhesive plastically deforms easily under the condition of room temperature, and distortion energy of a pellicle frame can be effectively relaxed. Furthermore, the mask adhesive according to the present invention is configured so that an adhesive residue is unlikely to remain. Therefore, even if the mask adhesive comes in contact with the hand of an operator, the mask adhesive is easily separated from the hand and thus also has excellent handleability.

The maximum value of tan δ of the mask adhesive is preferably 1.3 to 5, more preferably 1.3 to 3. The higher the maximum value of tan δ, the more easily the mask adhesive plastically deforms. Accordingly, a mask adhesive having a tan δ of 1.3 or more easily relaxes distortion energy of a pellicle frame when a pellicle is bonded to a mask. However, if the maximum value of tan δ is excessively high, the mask adhesive deforms excessively easily, and it tends to become difficult to retain the shape of a mask adhesive layer in the pellicle.

The storage modulus (G') of the mask adhesive at 25° C. is preferably $1\times10^3$ to $1\times10^7$ Pa, more preferably $1\times10^4$ to $1\times10^6$ Pa. The mask adhesive having a storage modulus (G') in the above range exhibits good handleability when used in a pellicle. The storage modulus (G') of the mask adhesive is easily increased with an increase in the content ratio of the thermoplastic elastomer (A). The loss modulus (G") of the mask adhesive at 25° C. is preferably $1\times10^3$ to $1\times10^7$ Pa, more preferably $1\times10^4$ to $1\times10^6$ Pa from the viewpoint of setting tan δ to the above range. The tan δ, the storage modulus (G'), and the loss modulus (G") of the mask adhesive can be measured by the same method as that described above.

The amount of outgas of the mask adhesive is preferably 20.0 μg/g or less, more preferably 10 μg/g or less. With the decrease in the amount of outgas, the amount of substances that cause haze decreases, and thus the generation of the haze tends to be further suppressed. The amount of outgas is a value determined by measuring, as an amount of gas generated (in terms of undecane), an amount of substances of outgas generated when the mask adhesive is heated at 100° C. for 30 minutes.

The mask adhesive according to the present invention preferably has a peel strength from a quartz glass substrate at 23° C. of 50 to 300 gf (0.49 to 2.94 N), more preferably 100 to 250 gf. The magnitude of the peel strength from the quartz glass substrate can be considered as an index of the presence or absence of an adhesive residue when a pellicle is peeled from a mask. When the peel strength from a quartz glass substrate at 23° C. is in the above range, an adhesive residue is unlikely to remain. Furthermore, even if the mask adhesive comes in contact with the hand of an operator, the mask adhesive is easily separated from the hand and thus also has excellent handleability. If the peel strength is less than 50 gf, adhesion reliability may decrease, for example, a pellicle may be detached during use or displacement of the bonding position may occur. On the other hand, if the peel strength exceeds 300 gf, an adhesive residue may remain after peeling.

The peel strength of the mask adhesive can be measured in accordance with the method described below. First, a cleaned quartz glass substrate (model "#6025 substrate", manufactured by HOYA Corporation, size: 152 mm×152 mm×6.35 mm) is prepared. A mask adhesive is then placed on the quartz glass substrate so as to conform to the shape of a pellicle. A pellicle frame (outer size: 149 mm×122 mm, frame height H: 5.8 mm, frame width W: 2 mm) made of aluminum is placed on the mask adhesive. Regarding the size of the mask adhesive, the outer size is 149 mm×122 mm, and a frame width W is 1.6 mm. A weight of 30 kg is placed on the pellicle frame, and this state is held for three minutes. The weight is then removed to prepare a stacked product including the quartz glass substrate, a mask adhesive layer, and the pellicle frame. Subsequently, the resulting stacked product is put on a glass substrate rack and stored at 23° C. for 10 days to stabilize the adhesive force. Thus, a measurement sample is prepared.

FIG. 1 is a sectional view that schematically illustrates a method for measuring the peel strength of a mask adhesive. As illustrated in FIG. 1, a stacked product including quartz glass substrate 20, mask adhesive layer 22, and pellicle frame 24 is set to, for example, peeling jig 28 of a standard universal testing machine (manufactured by INTESCO co., ltd.) such that a projection of peeling jig 28 is fitted into a jig hole (not shown) of pellicle frame 24. Weight 26 is placed on quartz glass substrate 20. Subsequently, a load-measuring lord cell of the standard universal testing machine is set to a speed of 20 mm/min. Under the condition of 23° C., an end portion of arm 32 of peeling jig 28 is pressed down with press-down jig 30. At this time, a load required for peeling mask adhesive layer 22 from quartz glass substrate 20 is defined as a "peel strength (gf)".

A stress residual percentage R(900) of a mask adhesive specified by following expression 1 is preferably 0≤R(900)≤20%, more preferably 0≤R(900)≤15%. When the stress residual percentage R(900) is in the above range, the mask adhesive easily relaxes distortion (stress) of a pellicle frame.

$$\text{Stress residual percentage } R(900) = \{F(900)/F(0)\} \times 100 \quad (1)$$

In expression 1, F(0) represents a maximum stress measured by a stress relaxation measurement, and F(900) represents a stress after the elapse of a test time of 900 seconds, the stress being measured by a stress relaxation measurement.

The degree of stress relaxation (speed of relaxation of stress) of a mask adhesive differs depending on the material constituting the mask adhesive, but can be quantified by the stress residual percentage R(t). This stress residual percentage R(t) is represented as a ratio (%) of a stress F(t) after the elapse of a test time of t seconds to a maximum stress F(0).

In a typical process for manufacturing a semiconductor, after pressure-bonding of a pellicle to a mask, residual stress of a pellicle frame is relaxed by a mask adhesive layer (distortion of the mask is eliminated), and a subsequent process is then performed. From the viewpoint of improving production efficiency, the time taken for reducing the residual stress is preferably short. In the present specification, a stress residual percentage R(900 s) at t=900 seconds is used as an index in consideration of the time required for a current typical mask-handling process. In addition, since a typical semiconductor manufacturing process is performed at room temperature (about 23° C.), a stress residual percentage measured at 23° C. is used as an index.

The F(0) and F(900) are values determined by using a rheometer under the condition of 23° C. For example, a dynamic viscoelasticity measuring apparatus (trade name "ARES", manufactured by TA Instruments Inc.) can be used as the rheometer. A disc-shaped specimen (diameter: 25 mm×thickness: 2 mm) is sandwiched between two parallel plates (diameter: 25 mm), which are measuring jigs, and the thickness of the specimen is adjusted to a predetermined initial gap. Subsequently, the F(0) and F(900) are determined in a nitrogen atmosphere, in a shear mode, at a strain of 1% and a measurement temperature of 23° C., and with an initial gap of 2 mm.

2. Pellicle

Figure 2:
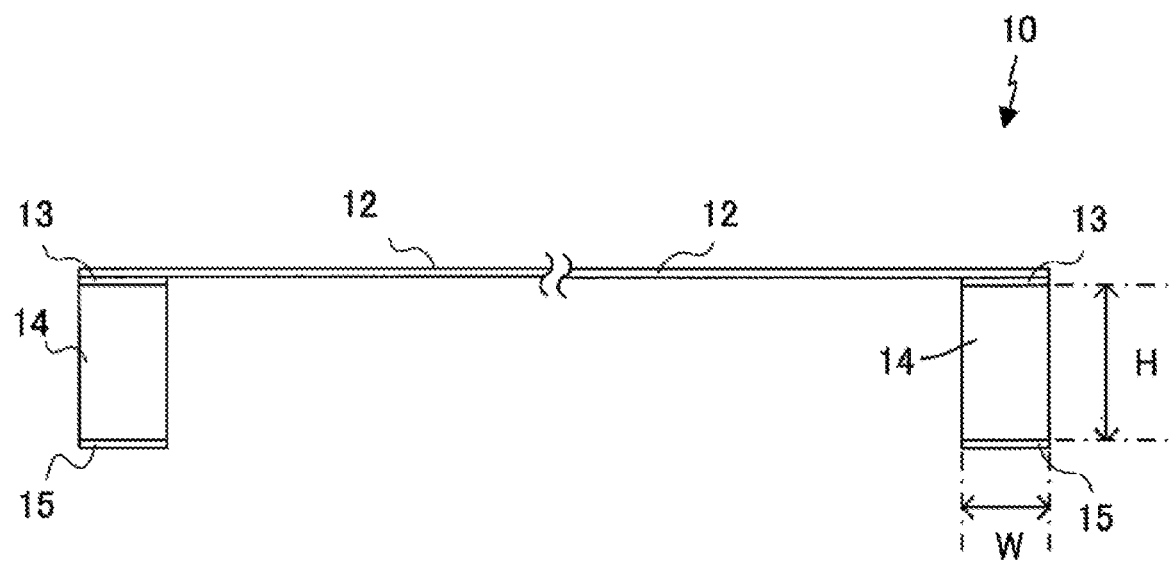
FIG. 2 is a schematic view illustrating a pellicle according to one embodiment of the present invention.

A pellicle according to the present invention includes a pellicle frame, a pellicle film disposed on one end face of the pellicle frame, and a mask adhesive layer disposed on the other end face of the pellicle frame and containing a mask adhesive. FIG. 2 is a schematic view illustrating a pellicle according to one embodiment of the present invention. Pellicle 10 according to this embodiment has pellicle film 12 and pellicle frame 14 that supports an outer periphery of pellicle film 12. Pellicle film 12 is provided in a tensioned state with film adhesive layer 13, which is disposed on one end face of pellicle frame 14, therebetween. Mask adhesive layer 15 is provided on the other end face of pellicle frame 14 so that pellicle frame 14 is bonded to a mask (not shown). Mask adhesive layer 15 is formed of the mask adhesive described above.

Pellicle film 12 is held by pellicle frame 14 and covers an exposure area of the mask. Accordingly, pellicle film 12 has a light-transmitting property so as not to block energy by exposure. Examples of the material of pellicle film 12 include transparent materials such as quartz glass, fluororesins, and cellulose acetate.

Pellicle frame 14 is, for example, an aluminum frame subjected to alumite treatment. Pellicle frame 14 is preferably black. This is for the purpose of preventing exposure light from reflecting and facilitating an inspection of the presence or absence of adhering foreign matter and the like.

Film adhesive layer 13 bonds pellicle frame 14 and pellicle film 12. Examples of film adhesive layer 13 include acrylic resin adhesives, epoxy resin adhesives, silicon resin adhesives, and fluoropolymers such as fluorine-containing silicon adhesives.

Mask adhesive layer 15 can be formed by applying and drying the mask adhesive described above. The method for applying the mask adhesive may be a known method. The mask adhesive can be applied to a desired portion by, for example, a method including pushing a spatula-like application nozzle against an end face of the pellicle frame, and discharging the mask adhesive from the application nozzle. Mask adhesive layer 15 has a thickness of about 0.3 to 1.0 mm.

A release sheet (separator) for protecting mask adhesive layer 15 may be disposed on the surface of mask adhesive layer 15. Examples of the release sheet include a polyethylene terephthalate film and a polypropylene film. The release sheet is peeled off when the pellicle is mounted on the mask.

After the release sheet is peeled off, pellicle 10 is attached onto a mask with mask adhesive layer 15 therebetween. Foreign matter adhering to the mask causes resolution defects on a wafer. Therefore, pellicle 10 is attached so as to cover the exposure area of the mask. This prevents foreign matter from adhering to the mask.

To mount pellicle 10 on the mask, a pellicle mounter (for example, manufactured by Matsushita Seiki Co., Ltd.) is used. The pellicle and the mask are disposed on the pellicle mounter, and the pellicle is pressure-bonded to the mask. The pellicle is pressure-bonded, for example, at room temperature and a pressure of about 20 kgf/cm$^2$ for about three minutes, although the pressure-bonding conditions depend on, for example, the type of the mask.

The mask can be a glass substrate made of synthetic quartz, quartz glass, or the like and having a patterned light-shielding film. The light-shielding film can be a film made of a metal such as Cr or MoSi and having a single-layer structure or a multilayer structure. The mask can have a thickness of, for example, about 6 mm.

Exposure light used for lithography in, for example, a process of forming a circuit pattern to be drawn on a semiconductor element is exposure light with a short wavelength, such as an i-line (wavelength: 365 nm) of a mercury lamp, a KrF excimer laser (wavelength: 248 nm), or an ArF excimer laser (wavelength: 193 nm).

As described above, the mask adhesive has a low sulfur content and is unlikely to generate ammonium sulfate, which causes an increase in haze of a pellicle film. Accordingly, even when a mask bonded to the pellicle is repeatedly used, a decrease in the accuracy of patterning, a decrease in the amount of exposure light, and the like are unlikely to occur.

The mask adhesive plastically deforms moderately in the exposure temperature region. Therefore, when the pellicle is mounted on a mask, the mask adhesive layer absorbs and relaxes distortion energy of the pellicle, and the mask is unlikely to distort. That is, it is possible to suppress a decrease in the patterning accuracy due to distortion of the mask. In addition, the mask adhesive is advantageous in that an adhesive residue is unlikely to remain on the mask after the pellicle is peeled from the mask, and that handleability is also excellent.

In double patterning, it is necessary to reduce relative displacement between two patterns as much as possible on the order of nanometers, and a high patterning accuracy is required. The pellicle according to the present invention is particularly suitable for double patterning because distortion of the pellicle is prevented from being transmitted to the mask.

EXAMPLES

The present invention will now be specifically described on the basis of Examples. The present invention is not limited to these Examples.

1. Preparation of Materials

Various components described below were used as raw materials of mask adhesives.

(Thermoplastic Elastomer (A))

H-SIS: Styrene-hydrogenated isoprene-styrene block copolymer (trade name "HYBRAR 7125" (manufactured by Kuraray Co., Ltd.), tan δ peak temperature: −5° C., styrene content ratio: 20 mass %, sulfur content: 3 μg/g or less)

SEBS: Styrene-ethylene•butylene-styrene block copolymer (trade name "G1657" (manufactured by KRATON Corporation), tan δ peak temperature: −48° C., sulfur content: 3 μg/g or less)

(Tackifier Resin (B))

P-100: C9-based hydrogenated petroleum resin (trade name "ARKON P-100" (manufactured by Arakawa Chemical Industries, Ltd.), softening point: 100±5° C., number-average molecular weight (Mn): 610)

(Process Oil (C))

PW-90 (a (refined product)): Paraffin-based process oil (trade name "DIANA PROCESS OIL PW-90" (manufactured by Idemitsu Kosan Co., Ltd.), sulfur content: 3 μg/g, number-average molecular weight (Mn): 850, kinematic viscosity (40° C.): 87 mm$^2$/s, proportion (% CP) of paraffin carbon: 71%, proportion (% CN) of naphthene carbon: 32%, In a molecular-weight distribution chart determined by a gel permeation chromatograph, the ratio of the peak area of a low-molecular-weight region where the molecular weight is 500 or less is 3.7% or less relative to the total peak area.)

PW-90 (b (unrefined product)): Paraffin-based process oil (trade name "DIANA PROCESS OIL PW-90" (manufactured by Idemitsu Kosan Co., Ltd.), sulfur content: 3 μg/g, number-average molecular weight (Mn): 790, kinematic viscosity (40° C.): 87 mm$^2$/s, proportion (% CP) of paraffin carbon: 70%, proportion (% CN) of naphthene carbon: 31%, In a molecular-weight distribution chart determined by a gel permeation chromatograph, the ratio of the peak area of a low-molecular-weight region where the molecular weight is 500 or less is 7.1% or less relative to the total peak area.)

PW-380: Paraffin-based process oil (trade name "DIANA PROCESS OIL PW-380" (manufactured by Idemitsu Kosan Co., Ltd.), sulfur content: 2 μg/g, number-average molecular weight (Mn): 1,220, kinematic viscosity (40° C.): 385 mm$^2$/s, proportion (% CP) of paraffin carbon: 73%, proportion (% CN) of naphthene carbon: 30%, In a molecular-weight distribution chart determined by a gel permeation chromatograph, the ratio of the peak area of a low-molecular-weight region where the molecular weight is 500 or less is 0.8% or less relative to the total peak area.)

MR-200: Paraffin-based process oil (trade name "NEOVAC MR-200" (manufactured by MORESCO CORPORATION), sulfur content: 2,500 μg/g, number-average molecular weight (Mn): 500, kinematic viscosity (40° C.): 71 mm$^2$/s, proportion (% CP) of paraffin carbon: 68%, proportion (% CN) of naphthene carbon: 30%)

(Softening Agent)

Liquid polybutene (Nissan polybutene 30N, manufactured by NOF CORPORATION)

(Fluidity Modifier)

Polypropylene wax (Licocene PP6102, manufactured by Clariant)

(GPC Measurement of Process Oils PW-90 and PW-380)

The molecular weights and the ratios of the low-molecular-weight component of the process oils PW-90 and PW-380 were measured by GPC using the following apparatus under the following conditions.

Apparatus: GPC HLC-8320 (manufactured by TOSOH CORPORATION)
Solvent: tetrahydrofuran
Column: TSKgel G7000×1, TSKgel G4000×2, TSKgel G2000×1 (each manufactured by TOSOH CORPORATION)
Flow rate: 1.0 mL/min
Sample: 10 mg/mL tetrahydrofuran solution
Sample concentration: 1 g/L
Amount of injection: 5 mL
Detector: infrared spectrometer
Measurement temperature: 40° C.
Standard substances: polystyrene (Measurement of Molecular Weight of Process Oil MR-200)

Regarding the molecular weight of the process oil MR-200, the n-d-m ring analysis was conducted in accordance with ASTM D3238. Subsequently, the molecular weight was calculated on the basis of the computation expression published by Alfred E. Hirschler using obtained temperature, viscosity, and density data.

2. Production of Pellicle

Example 1

Preparation of Mask Adhesive

One hundred parts by mass of H-SIS serving as the thermoplastic elastomer (A), 100 parts by mass of P-100 serving as the tackifier resin (B), and 60 parts by mass of PW-90 serving as the process oil (C) were mixed. In a Labo Plastomill (manufactured by Toyo Seiki Seisaku-sho Ltd., interior capacity: 60 mL), 48 g of the resulting mixture was charged and sealed. Subsequently, kneading was performed in the Labo Plastomill at 200° C. and 100 rpm for 20 seconds to prepare a block-like mask adhesive. About 10 g of the mask adhesive was charged in a heating tank (temperature in the tank: 200° C.) and melted.

Preparation of Pellicle

Pellicle frame 14 (outer size: 149 mm×122 mm, frame height H: 5.8 mm, frame width W: 2 mm) made of anodized aluminum and illustrated in FIG. 2 was prepared. Subsequently, a mask adhesive in a molten state, the mask adhesive being extruded from a needle tip that communicates with the heating tank, was applied to one end face of pellicle frame 14 to form mask adhesive layer 15. Mask adhesive layer 15 had a thickness of 0.6 mm. A separator was then disposed on the surface of mask adhesive layer 15. Pellicle film 12 was bonded onto the other end face of pellicle frame 14 (the end face on which mask adhesive layer 15 was not formed) with film adhesive layer 13 therebetween. Thus, pellicle 10 was produced.

Examples 2 and 3 and Comparative Examples 1 and 2

Mask adhesives were prepared as in Example 1 except that the compositions of the mask adhesives were changed as shown in Table 1 below, and pellicles were produced.

3. Evaluation

Physical properties of the mask adhesives prepared in Examples and Comparative Examples, and the pellicles produced in Examples and Comparative Examples were evaluated by the following procedures.

(1) Determination of Sulfur Content of Mask Adhesive

The sulfur content of each of the mask adhesives was determined as follows. The mask adhesive was precisely weighed in a sample boat and decomposed by combustion at 900° C. (combustion furnace set temperature) in a stream of Ar/O$_2$, and the generated gas was absorbed by a liquid absorbent. Subsequently, the amount of sulfur atoms was quantified by ion chromatography (apparatus used: ICS-3000 (Thermo Fisher Scientific Inc.). The sulfur content of each of the process oils was also measured in the same manner.

(2) Tan δ Peak Temperature, Maximum Value of Tan δ, Storage Modulus (G'), and Loss Modulus (G") of Mask Adhesive A disc-shaped layer formed of the mask adhesive (diameter: 25 mm×thickness: 2 mm) was sandwiched between two parallel plates (diameter: 25 mm), which were measuring jigs, by using a dynamic viscoelasticity measuring apparatus (trade name "ARES", manufactured by TA Instruments, Inc.). The thickness of the specimen was adjusted to a predetermined initial gap. Subsequently, the storage modulus (G') and the loss modulus (G") were measured in a nitrogen atmosphere, in a shear mode, at a frequency of 1 Hz, a measurement temperature of −80° C. to 200° C., and a temperature-increasing rate of 3° C./min, and with an initial gap of 2 mm.

From the determined storage modulus (G') and loss modulus (G"), tan δ (=G"/G') was calculated. The temperature (tan δ peak temperature) at which tan δ had a maximum value and the maximum value were determined. The storage modulus (G') and loss modulus (G") at 25° C. were also determined.

(3) Stress Residual Percentage R(900) of Mask Adhesive

With a dynamic viscoelasticity measuring apparatus (trade name "ARES", manufactured by TA Instruments, Inc.), a disc-shaped layer formed of the mask adhesive (diameter: 25 mm×thickness: 2 mm) was sandwiched between two parallel plates (diameter: 25 mm), which were measuring jigs, and the thickness of the specimen was adjusted to a predetermined initial gap. Subsequently, a stress F(t) at a measurement time t was measured in a nitrogen atmosphere, in a shear mode, at a strain of 1% and a measurement temperature of 23° C., and with an initial gap of 2 mm. The stress residual percentage R(900) was calculated from the "maximum stress F(0)" and the stress "F(900)" after the elapse of a test time of 900 seconds.

(4) Peel Strength of Mask Adhesive from Quartz Glass Substrate

A cleaned quartz glass substrate (model "#6025 substrate", manufactured by HOYA Corporation, size: 152 mm×152 mm×6.35 mm) was prepared. The mask adhesive was applied onto the quartz glass substrate in a frame shape (outer size: 149 mm×122 mm, frame width W: 1.6 mm). A pellicle frame (outer size: 149 mm×122 mm, frame height H: 5.8 mm, frame width W: 2 mm) was then placed on the resulting mask adhesive layer. A weight of 30 kg was placed on the pellicle frame, and this state was held for three minutes. The weight was then removed to prepare a stacked product including the quartz glass substrate, the mask adhesive layer, and the pellicle frame. The resulting stacked product was put on a glass substrate rack and stored at 23° C. for 10 days to stabilize the adhesive force. Thus, a measurement sample was prepared.

As illustrated in FIG. 1, the stacked product including quartz glass substrate 20, mask adhesive layer 22, and pellicle frame 24 was set to peeling jig 28 of a standard universal testing machine (manufactured by INTESCO co., ltd.) such that a projection of peeling jig 28 was fitted into a jig hole (not shown) of pellicle frame 24. Weight 26 was placed on quartz glass substrate 20. A load-measuring lord cell of the standard universal testing machine was set to a speed of 20 mm/min. Under the condition of 23° C., an end portion of arm 32 of peeling jig 28 was pressed down with press-down jig 30. A load required for peeling mask adhesive layer 22 from quartz glass substrate 20 was determined as a "peel strength (gf)".

(5) Amount of Distortion of Mask

The pellicle produced in Example or Comparative Example and a mask (thickness: 6.35 mm) made of quartz glass were disposed on a pellicle mounter (manufactured by Matsushita Seiki Co., Ltd.). These were pressure-bonded to each other at a temperature of room temperature (25° C.) and a pressure of 20 kgf/cm$^2$ for a pressure-bonding time of three minutes. An amount of distortion of the mask on which the pellicle was mounted was measured by using a flatness measurement analyzer (trade name "UltraFlat 200 Mask", manufactured by Corning Tropel). The measurement area was 146 mm$^2$.

A mask on which a pellicle is mounted usually reflects distortion of a pellicle frame (aluminum frame) and is distorted like a bow. In the measurement of the entire mask using the flatness measurement analyzer, the state of distortion of the mask is shown as a contour map, and the difference between the maximum value and the minimum value of the amount of distortion is shown. The difference ((1)-(2)) between an amount (1) of distortion of the entire mask before mounting of the pellicle and an amount (2) of distortion of the entire mask after mounting of the pellicle was determined as an "amount (nm) of distortion of the mask" generated by mounting of the pellicle. The amount of distortion of the mask is preferably as small as possible. Most preferably, the amount of distortion of the mask is "0" (that is, no distortion is generated).

(6) Amount of Displacement of Exposure Pattern

The pellicle was mounted on a mask as in the measurement of the amount of distortion of the mask. Subsequently, a wafer (6025 substrate, thickness: 6.35 mm, length: 151.95 mm) was exposed through the mask twice by using a semiconductor exposure apparatus (trade name "ArF immersion scanner NSR-S610C" manufactured by Nikon Corporation) to form patterns on the wafer. More specifically, after a first exposure was performed, the mask was shifted, and a second exposure was performed. Subsequently, an amount of displacement (distance) between the pattern formed by the first exposure and the pattern formed by the second exposure was measured by observation with a scanning electron microscope (SEM). The difference (X−Y) between the measured distance (X) and the amount (Y) of the shift of the mask was determined as an "amount (nm) of displacement of the pattern". The amount of displacement of the pattern is preferably as small as possible. An amount of displacement of the pattern of 5 nm or less was evaluated as "good", and an amount of displacement of the pattern of more than 5 nm was evaluated as "poor".

(7) Adhesive Residue

The pellicle was mounted on a mask as in the measurement of the amount of distortion of the mask. The pellicle was then peeled off from the mask, and the surface of the mask after the pellicle was peeled off was observed with a microscope by using an illumination apparatus (trade name: High-Intensity Halogen Lamp Source Spotlights 370TFI/R, manufacture by SENA and VANS Co., Ltd.). When an adhesive residue was observed, the width thereof was measured and evaluated in accordance with the following criteria.

A: The ratio of the width of the adhesive residue to the width of the adhesive was less than 5%. Alternatively, no adhesive residue was observed.

B: The ratio of the width of the adhesive residue to the width of the adhesive was 5% or more and less than 20%.

C: The ratio of the width of the adhesive residue to the width of the adhesive was 20% or more.

(8) Amount of Outgas

In a glass insert with a cap having two ports, 10 mg of the mask adhesive was put, and the glass insert was set in a thermal desorption apparatus (TDTS-2020). While $H_2$ gas was introduced as a carrier gas from one of the ports, heating was performed at 100° C. for 30 minutes to extract a volatile component, and the volatile component was then condensed by a cold trap at −20° C. Subsequently, the cold trap was reheated to 280° C. at 10° C./min, and the extracted, condensed volatile component was determined, as an amount of gas generated (in terms of undecane), by using a gas chromatograph (GC) and a mass spectrometer. A thermal desorption GC-MS (TDTS-2010), a gas chromatograph (GC-2010), and a mass spectrometer (GCMS-QP2010) manufactured by Shimadzu Corporation were used for the measurement.

(9) Haze (Amount of Foreign Matter Adhering) During Exposure

Figure 3:
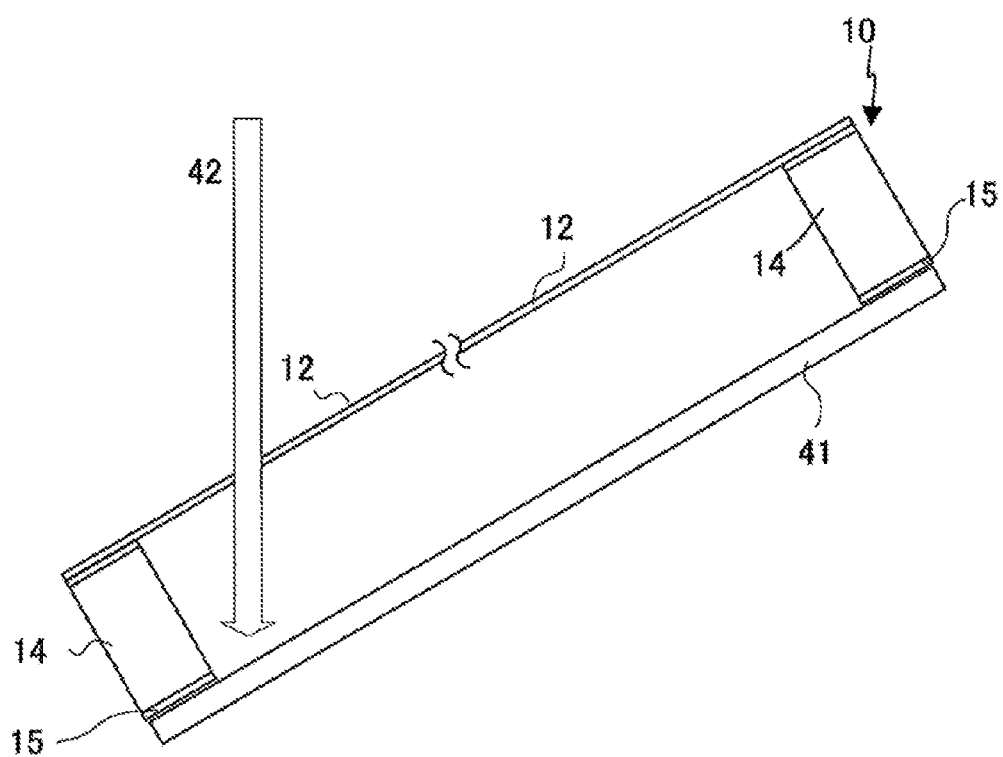
FIG. 3 is a sectional view that schematically illustrates a method for examining an amount of foreign matter adhering during exposure of a pellicle.

As illustrated in FIG. 3, pellicle 10 produced in each of Examples and Comparative Examples was bonded onto quartz glass 41 (outer size: 20 cm×20 cm, thickness: 2.3 mm). The pellicle was then diagonally fixed at an angle of 45°, and 5-mm square ArF light 42 (energy density: 0.5 mJ/cm², frequency: 1,000 Hz) was applied so that the inner surface of pellicle frame 14 and mask adhesive layer 15 were irradiated with ArF light 42.

When the total amount of energy of ArF light 42 in the irradiated portion was 1000 J, 2000 J, 3000 J, 4000 J, and 5000 J, the number of foreign matter having a size of 0.3 μm or more and generated on the inner surface of pellicle film 12 was measured with a film surface foreign matter inspection machine (YPI-MX, manufactured by YGK Corporation).

TABLE 1

| | | | Example 1 | Example 2 | Example 3 | Comparative Example 1 | Comparative Example 2 |
|---|---|---|---|---|---|---|---|
| Composition | Thermoplastic elastomer (A) | H-SIS (tanδ peak temperature: −5° C.) | 100 | 100 | 100 | 100 | — |
| | | SEBS G1657 (tanδ peak temperature: −48° C.) | — | — | — | — | 67 |
| | Tackifier resin (B) | P-100 | 100 | 100 | 100 | 100 | 67 |
| | Paraffin-based process oil (C1) | PW-90 (a) Ratio of region where molecular weight is 500 or less: 3.7% | 60 | — | — | — | — |
| | | PW-90 (b) Ratio of region where molecular weight is 500 or less: 7.1% | — | 60 | — | — | — |
| | | PW-380 Ratio of region where molecular weight is 500 or less: 0.8% | — | — | 60 | — | — |
| | | MR-200 | — | — | — | 60 | — |
| | Softening agent | Liquid polybutene | — | — | — | — | 100 |
| | Fluidity modifier | PP wax | — | — | — | — | 23 |
| Measurement/ evaluation results | (1) Sulfur content μg/g) of mask adhesive | | <1 | <1 | <1 | 600 | 1 |
| | (2) Tanδ peak temperature (° C.) of mask adhesive | | 14 | 14 | 21 | 10 | −23 |
| | (2) Maximum value of tanδ of mask adhesive | | 2.6 | 2.6 | 2.3 | 3.0 | 1.0 |
| | (2) Storage modulus (G') at 25° C. | | 1.11E+05 | 1.09E+05 | 2.30E+05 | 5.80E+04 | 2.60E+05 |
| | (2) Loss modulus (G") at 25° C. | | 1.42E+05 | 1.43E+05 | 4.80E+05 | 6.70E+04 | 5.40E+04 |
| | (3) Stress residual percentage R(900) (%) | | 6 | 6 | 6 | 4 | 32 |
| | (4) Peel strength (gf) of mask adhesive from quartz glass substrate | | 450 | 500 | 450 | 250 | 1000 |
| | (5) Amount (nm) of distortion of mask | | 40 | 40 | 40 | 50 | 80 |
| | (6) Amount (nm) of displacement of exposure pattern | | 2 | 2 | 2 | 2 | 5 |
| | (6) Evaluation of amount of displacement of exposure pattern | | Good | Good | Good | Good | Poor |
| | (7) Adhesive residue after peeling | | A | A | A | A | C |
| | (8) Amount μg/g) of outgas | | 7.1 | 150 | 7.1 | 50 | 22 |
| | (9) Amount (number) of foreign matter adhering during exposure | 0 J | 0 | 0 | 0 | 0 | 0 |
| | | 1000 J | 3 | 5 | 4 | 3 | 2 |
| | | 2000 J | 25 | 25 | 26 | 27 | 25 |
| | | 3000 J | 22 | 31 | 23 | 57 | 28 |
| | | 4000 J | 27 | 29 | 25 | 50 | 30 |
| | | 5000 J | 23 | 35 | 25 | 50 | 22 |

As shown in Table 1, the mask adhesives having a sulfur content of 300 μg/g or less had small amounts of foreign matter adhering during exposure (Examples 1 to 3 and Comparative Example 2). Presumably, during ArF light irradiation, ammonium sulfate was unlikely to generate, foreign matter did not adhere to the pellicle film, and haze was unlikely to generate.

However, it is found that in the case where the mask adhesive contains a softening agent other than a process oil (Comparative Example 2), there is room for improvement in adhesive residue after peeling and the amount of displacement of the exposure pattern. Presumably, since the mask adhesive had a low tan δ peak temperature, and the mask adhesive layer was unlikely to plastically deform during exposure, distortion of the pellicle frame was transmitted to the mask, and displacement and the like tended to occur.

In contrast, it is found that the mask adhesive having a sulfur content of more than 300 μg/g has room for improvement in the amount of foreign matter adhering during exposure (Comparative Example 1). Presumably, at a high sulfur content in the mask adhesive, the sulfur reacted with ozone and ammonium ions generated during irradiation with ArF light, and ammonium sulfate adhered to the pellicle film easily.

The present application claims propriety to Japanese Patent Application No. 2018-067006, filed on Mar. 30, 2018. The entire contents described in the specification and drawings of the application are hereby incorporated herein by reference.

REFERENCE SIGNS LIST

10 Pellicle
12 Pellicle film
13 Film adhesive layer
14, 24 Pellicle frame
15 Mask adhesive layer
20 Quartz glass substrate
22 Mask adhesive layer
26 Weight
28 Peeling jig
30 Press-down jig
32 Arm
41 Quartz glass
42 ArF light

The invention claimed is:

1. A mask adhesive comprising:
100 parts by mass of a thermoplastic elastomer (A) in which a loss tangent measured from −80° C. to 200° C. at a frequency of 1 Hz has a maximum value at a temperature of −20° C. to 30° C.;
20 to 150 parts by mass of a tackifier resin (B); and
20 to 150 parts by mass of a process oil (C), wherein
an amount of softening agent selected from the group consisting of polybutene, hydrogenated polybutene, unsaturated polybutene, aliphatic hydrocarbons (excluding the process oil (C)), and acrylic polymers is 0 to 1 part by mass relative to 100 parts by mass of the thermoplastic elastomer (A),
the thermoplastic elastomer (A) is at least one selected from the group consisting of a styrene-based thermoplastic elastomer, a (meth)acrylate-based thermoplastic elastomer, and an olefin-based thermoplastic elastomer,
in the process oil (C), a total of a proportion (% CP) of paraffin carbon and a proportion (% CN) of naphthene carbon is 50% or more,
in a molecular-weight distribution chart obtained by gel permeation chromatography of the process oil (C), a ratio of an area of a region where the molecular-weight is 500 or less is 5% or less,
in the mask adhesive, a loss tangent measured from −80° C. to 200° C. at a frequency of 1 Hz has a maximum value at a temperature of −10° C. to 30° C., and
the mask adhesive has a sulfur content of 300 μg/g or less.

2. The mask adhesive according to claim 1, wherein:
the process oil (C) has a sulfur content of 2,000 μg/g or less.

3. The mask adhesive according to claim 1, wherein:
the proportion (% CP) of paraffin carbon in the process oil (C) is 50% or more.

4. The mask adhesive according to claim 1, wherein:
the process oil (C) contains a paraffin-based process oil (C1); and
the paraffin-based process oil (C1) has a number-average molecular weight of 300 to 1,500.

5. The mask adhesive according to claim 4, wherein:
the paraffin-based process oil (C1) has a kinematic viscosity of 50 to 400 mm$^2$/s at 40° C.

6. The mask adhesive according to claim 1, wherein:
an amount of outgas is 20.0 μg/g or less.

7. The mask adhesive according to claim 1, wherein:
the thermoplastic elastomer (A) is a styrene-based thermoplastic elastomer.

8. The mask adhesive according to claim 7, wherein:
the styrene-based thermoplastic elastomer is a triblock copolymer that has a first polystyrene block, a polyisoprene block having an isopropenyl group in a side chain thereof, and a second polystyrene block and/or a hydride of the triblock copolymer.

9. The mask adhesive according to claim 1, wherein:
the tackifier resin (B) has a softening point of 60° C. to 150° C., the softening point being measured based on a ring-and-ball method specified in JIS K-2207.

10. The mask adhesive according to claim 1, wherein:
the tackifier resin (B) has a number-average molecular weight of 300 to 3,000.

11. The mask adhesive according to claim 1, wherein:
the tackifier resin (B) is at least one selected from the group consisting of rosin and derivatives thereof, polyterpene resins and hydrides thereof, terpene phenolic resins and hydrides thereof, aromatic modified terpene resins and hydrides thereof, coumarone-indene resins, aliphatic petroleum resins, alicyclic petroleum resins and hydrides thereof, aromatic petroleum resins and hydrides thereof, aliphatic-aromatic copolymer-based petroleum resins, and dicyclopentadiene-based petroleum resins and hydrides thereof.

12. A pellicle comprising a pellicle frame, a pellicle film disposed on one end face of the pellicle frame, and a mask adhesive layer disposed on the other end face of the pellicle frame and containing the mask adhesive according to claim 1.

* * * * *